GLASS SEALED CERAMIC HOUSINGS FOR SEMICONDUCTOR DEVICES

Filed March 28, 1963

INVENTORS
KOICHI URUSHIDA
SHINZO ANAZAWA
BY Hopgood & Calimafde
ATTORNEYS

United States Patent Office 3,335,336

Patented Aug. 8, 1967

3,335,336

GLASS SEALED CERAMIC HOUSINGS FOR SEMICONDUCTOR DEVICES

Koichi Urushida and Shinzo Anazawa, Tokyo, Japan, assignors to Nippon Electric Company Limited, Tokyo, Japan, a corporation of Japan Filed May 28, 1963, Ser. No. 283,799
Claims priority, application Japan, June 4, 1962, 37/29,844
3 Claims. (Cl. 317—234)

This invention relates to an improved ceramic seal for semiconductor devices such as transistors, diodes, or the like.

Most of the conventional containers for semiconductor devices take the form of containers that are constructed by mounting a semiconductor element on a stem member provided with metallic leads and by fitting a cap over the stem member and sealing it. In this prior art construction, the metallic leads are inserted through openings in the stem member in a prior operation. Such construction involves the disadvantages that the assembly of the components of the container structure is relatively complicated and the container size is relatively large with the result that the efficiency of manufacture is relatively low.

This invention has for its object to eliminatae these disadvantages. According to the features of the invention, a container mounting a semiconductor element therein is formed from two ceramic parts sealed together at their peripheries by an insulating material such as glass with the necessary electrodes extending out through the glass. Either or both of the ceramic parts may have a recess on their inner side to provide room for the semiconductor material.

The invention will now be described with reference to the attached drawings, in which.

Figure 1:
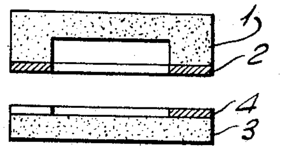
FIG. 1 is an elevation section of one container of this invention.
Figure 2:
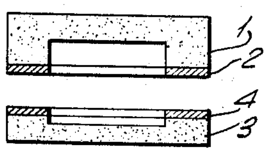
FIG. 2 is an elevation section of a second container of this invention.

As shown in FIGS. 1 and 2, a glaze 2 and 4 such as glass is applied over the periphery on one side of each of the ceramic parts 1, 3.

Figure 1A:
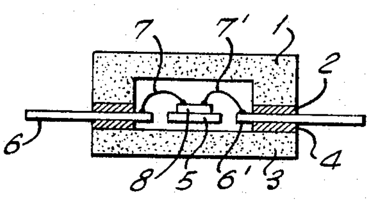
FIG. 1A shows a semiconductor device encased in the container of FIG. 1.
Figure 2A:
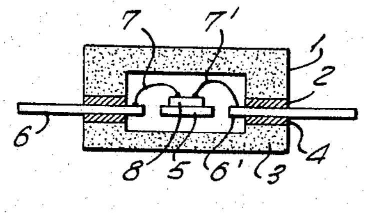
FIG. 2A shows a semiconductor device encased in the container of FIG. 2.

Then as shown in FIGS. 1A and 2A, a transistor element 8 of diffusion type, for example, is mounted on a metallic piece 5 which serves as the collector electrode, and the emitter and base regions of the element are connected via conductors 7, 7′ to leads 6 and 6′ which serve as emitter and base electrodes, respectively. These electrodes are passed between glazes 2 and 4 to the outside of the container. Thereafter, the glazes 2 and 4 are heated to a low temperature such as 350° C.–550° C. where they melt and are bound together upon cooling to make a seal.

Figure 3:
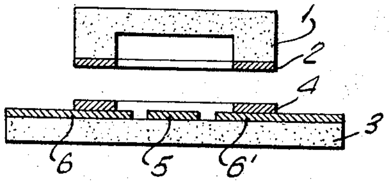
FIG. 3 is an elevation section of a third container of this invention.
Figure 3A:
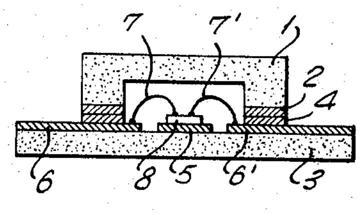
FIG. 3A shows a semiconductor device encased in the container of FIG. 3.

FIG. 3 shows an embodiment similar to that in FIGS. 1 and 2. In this case, each lead 5, 6 and 6′ is formed by metallized layer on the surface of ceramic part 3. FIG. 3A shows the corresponding device completed.

Figure 4:
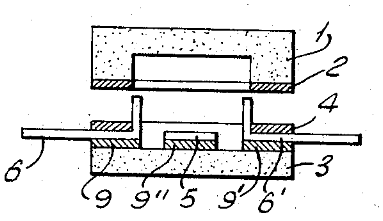
FIG. 4 is an elevation section of a fourth container of this invention.
Figure 4A:
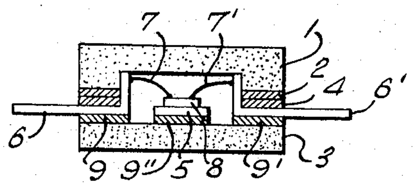
FIG. 4A shows a semiconductor device encased in the container of FIG. 4.

FIG. 4 shows an embodiment similar to those in FIGS. 1 and 2. In the embodiment of FIG. 4 each of the leads 5, 6 and 6′ is fixed in advance on the surface of ceramic part 3 by means of metallized layers, 9, 9′ and 9″. FIG. 4A shows the corresponding device completed.

As seen, the semiconductor container of this invention employs glazed ceramic parts having recesses on the side. It is possible to make the glazed layer very thin without damaging the insulation between any of the semiconductor leads sealed between the glazed ceramic parts. It is also possible to reduce the height of the container to the smallest dimension limited by the thickness of the semiconductor assembly and by the required mechanical strength of the ceramic parts. It is also possible to minimize the flow-deformation of the glaze during the heating, melting and sealing process and obtain a uniform construction based on a simple assembly technique. If desired, application of the glaze may easily be limited to the peripheries.

Thus, the invention presents ceramic seals characterized by a perfect sealing, a reduced cost and miniaturization of the container required for semiconductor devices.

Although a heat-sealed glaze has been used in the above described embodiments of the invention, the invention is by no means limited to the use of glazes as a sealing material. Organic plasters could be used instead of a glaze if desired. This and many other modifications of the invention will be apparent to those skilled in the art, and this invention includes all modifications falling within the scope of the following claims.

What is claimed is:

1. A semiconductor device comprising a first ceramic member and a second ceramic member for forming an envelope around a semiconductor element, each of said members having mating surface portions facing one another, at least one of said members having a recess therein, a semiconductor element provided in said recess, a plurality of thin metallized layer strips deposited on the surface of one of said members in the region between said mating portions, each electrode of said semiconductor element being electrically connected to a different one of said metallized strips, said members having a seal securing the same together at said mating portions, said seal comprising a glaze material for forming a hermetic seal with the surfaces of said mating portions and with said metallized strips, said seal further being formed from a first layer of glaze material provided on one mating portion surface and a second layer of glaze material provided on the other mating portion surface prior to the formation of said seal, and the resulting device being of generally planar shape.

2. The invention described in claim 1 wherein the ceramic member carrying said metallized strips extends generally beyond the boundaries of the other ceramic member and wherein said metallized strips comprise the sole means for connecting said semiconductor element to means external to the resulting envelope.

3. The invention described in claim 1 which further includes a conductor overlying each of said metallized strips and in contact therewith, a different conductor being provided for connecting each electrode of said semiconductor element to means external to the resulting envelope.

References Cited

UNITED STATES PATENTS

| | | | |
|---|---|---|---|
| 2,716,722 | 8/1955 | Rothstein | 317—235 |
| 2,799,814 | 7/1957 | Schwartz et al. | 317—234 |
| 3,177,576 | 4/1965 | Kuzminski | 317—235 |
| 3,213,337 | 10/1965 | Long | 317—234 |
| 3,220,095 | 11/1965 | Smith | 29—155.5 |

JOHN W. HUCKERT, *Primary Examiner.*

R. F. SANDLER, *Assistant Examiner.*